(12) United States Patent
Oishi

(10) Patent No.: US 7,969,530 B2
(45) Date of Patent: Jun. 28, 2011

(54) LIGHT-EMITTING DIODE AND METHOD FOR MANUFACTURING THE SAME

(75) Inventor: Nodoka Oishi, Minamitsuru-gun (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 577 days.

(21) Appl. No.: 12/051,228

(22) Filed: Mar. 19, 2008

(65) Prior Publication Data

US 2008/0231771 A1 Sep. 25, 2008

(30) Foreign Application Priority Data

Mar. 19, 2007 (JP) ................................. 2007-069839

(51) Int. Cl.
  *G02F 1/1335* (2006.01)
(52) U.S. Cl. ......... 349/62; 362/97.1; 362/97.3; 362/555
(58) Field of Classification Search ................ 362/97.1, 362/97, 3, 555
  See application file for complete search history.

(56) References Cited

U.S. PATENT DOCUMENTS

2002/0006040 A1* 1/2002 Kamada et al. ............... 362/237
2006/0119751 A1* 6/2006 Suehiro et al. .................... 349/5

FOREIGN PATENT DOCUMENTS

JP 11-284234 A 10/1999
JP 2006-012763 A 1/2006

* cited by examiner

*Primary Examiner* — David Nelms
*Assistant Examiner* — David Y Chung
(74) *Attorney, Agent, or Firm* — Browdy and Neimark, PLLC

(57) ABSTRACT

An LED which includes a substrate, at least one light-emitting element mounted on, and electrically connected to, the substrate, and a sealing member mounted to the substrate so as to seal the light-emitting element. The sealing member contains an inorganic material having a high contrast ratio and a high reflectivity in an amount which accords with the luminance of the light-emitting element.

7 Claims, 5 Drawing Sheets

Sealing member producing step (a)

(b)

LIGHT-EMITTING DIODE AND METHOD FOR MANUFACTURING THE SAME

CROSS-REFERENCE TO THE RELATED APPLICATION

This application is based on and claims the priority benefit of Japanese Patent Application No. 2007-069839, filed on Mar. 19, 2007, the disclosure of which is incorporated herein by reference in its entirety.

BACKGROUND OF THE INVENTION

1. Field of the Invention

The present invention relates to a light-emitting diode used mainly as a light source and to a method for manufacturing the same.

2. Description of Related Art

Light-emitting diodes (hereinbelow referred to as LEDs) have advantages of long life and low power consumption due to high light-emitting efficiency and there are high expectations for their use as light sources. However, such LEDs have a problem in that the luminance is difficult to control, i.e., a desired luminance is difficult to obtain.

A surface-mount-type LED is composed of a light-emitting element mounted on a substrate and a resin-sealing the light-emitting element. To control luminance of the light emitted from such LEDs, a method has been proposed in which $SiO_2$ is added to the resin. However, in order to reduce the brightness of the LEDs, a large amount of $SiO_2$ must be added to the resin, and this can cause a problem in that the workability and the properties of the cured resin are adversely affected.

To improve the light-emitting efficiency of the LEDs, a method has been proposed in which a member composed of an inorganic material such as titanium dioxide is provided around the light-emitting element and serves as a light scattering layer (see, for example, Japanese Patent Application Laid-Open No. Hei 11-284234).

However, in the proposed method, the titanium dioxide is used for improving the light-emitting efficiency of the LEDs, but does not improve the uniformity of the luminance of the emitted light. Moreover, in the case where a plurality of the LEDs are used, a method for improving the uniformity of the overall luminance of the LEDs has not been proposed.

For example, in backlights for large liquid crystal displays of 30 inches or more or for lighting devices for interior illumination, the use of LEDs as light sources is desirable in terms of life and power consumption. However, since a plurality of point light sources are used in the light source device, it is difficult to improve the uniformity of the luminance of light emitted from a light-emitting surface of the light source device.

In order to solve this problem, a method has been proposed in which the shape of an LED housing of a light guide plate is specially designed (see, for example, Japanese Patent Application Laid-Open No. 2006-12763).

However, the proposed method is based on the premise that the luminances of the LEDs serving as light sources are the same. Therefore, unless the plurality of LEDs each have an equal luminance to one another, it is difficult to maintain uniformity of the overall luminance of the LEDs.

SUMMARY OF THE INVENTION

It is an object of the present invention to provide an LED that can offer an adjustable luminance and to provide a method for manufacturing the same. Moreover, it is an object of the invention to provide a light source in which the overall luminance can be made uniform.

In order to achieve the above object, an LED according to one embodiment of the present invention includes: a substrate; at least one light-emitting element mounted on the substrate; and a sealing member mounted on the substrate and sealing the light-emitting element.

The sealing member contains an inorganic material having a high light-shielding ratio and a high reflectivity, and the amount of the inorganic material is adjusted in accordance with the luminance of the light-emitting element.

BRIEF DESCRIPTION OF THE DRAWINGS

FIG. 5a is a perspective view of a backlight in which the LEDs according to the present invention are used as light sources; and FIG. 5b is a side view of the backlight shown in FIG. 5a.

DETAILED DESCRIPTION OF THE PREFERRED EMBODIMENTS

Hereinbelow, preferred embodiments of the present invention will be described in detail with reference to the accompanying drawings.

Figure 1:
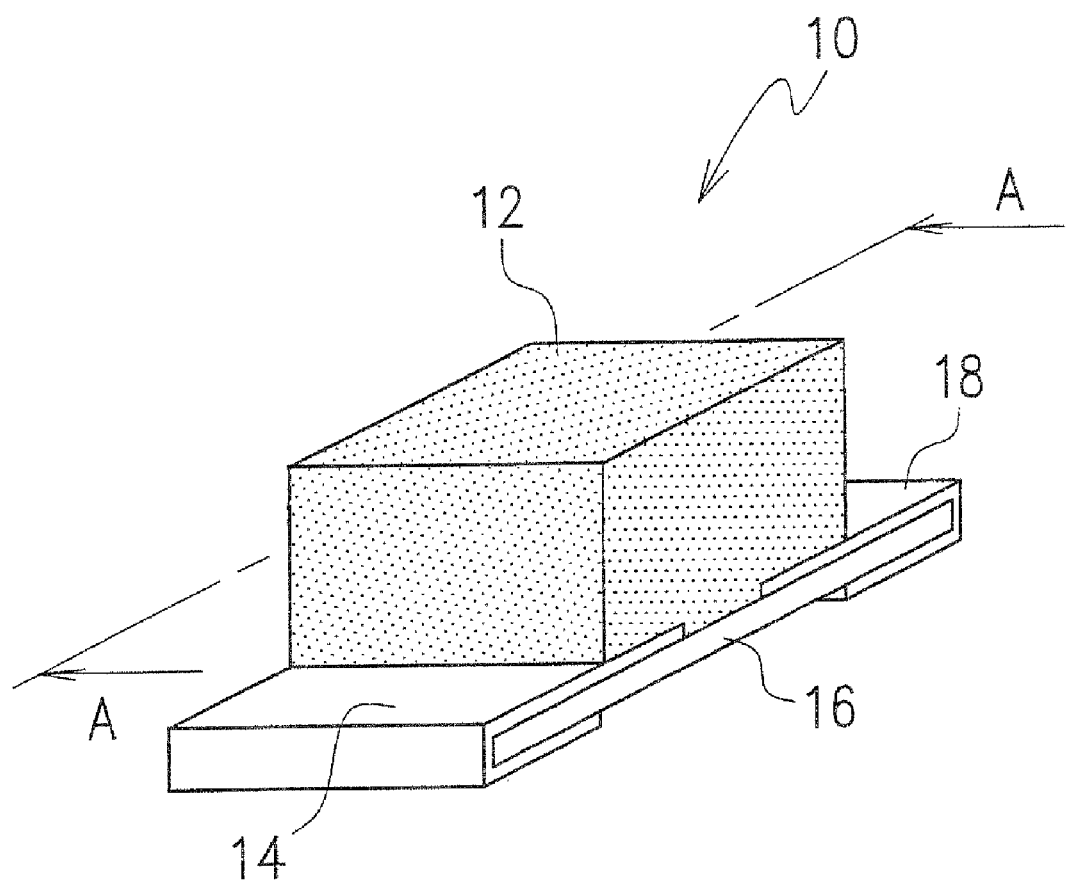
FIG. 1 is a perspective view illustrating an LED according to a first embodiment of the present invention.
Figure 2:
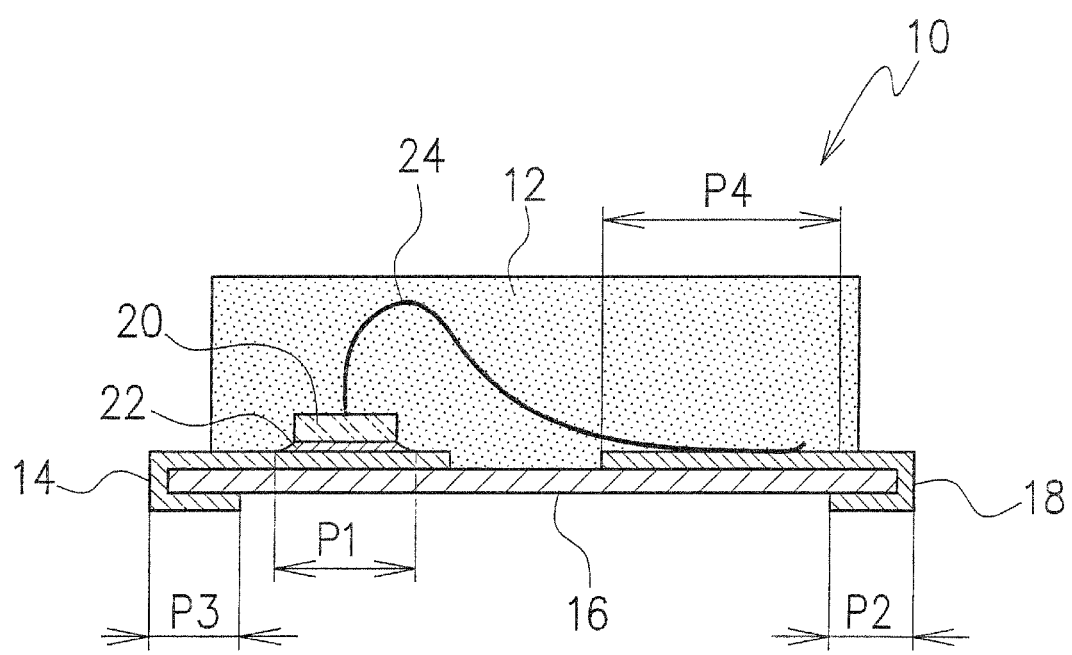
FIG. 2 is a cross-sectional view taken along the line A-A in FIG. 1.

FIGS. 1 and 2 show a first embodiment of an LED according to the present invention.

The LED 10 of the first embodiment is of a surface-mount-type LED. The LED 10 includes a substrate 16 composed of, for example, a rectangular plate, and a pair of electrodes 14 and 18 provided on the left and right sides (as viewed in FIG. 2), respectively, of the substrate 16. Each of the electrodes 14 and 18 extends from an upper surface via a side surface to a lower surface of the substrate 16.

A light-emitting element 20 in this embodiment has its electrodes at an upper surface and at an lower surface thereof, is placed on the left electrode 14 of the substrate 16, and thus the lower electrode of the light-emitting element 20 is electrically connected to the left electrode 14 of the substrate 16 through a conductive paste 22. The upper electrode of the light-emitting element 20 is connected to the right electrode portion 18 through, for example, a metal wire 24 (see FIG. 2). A light-emitting element 20 may be electrically connected to the substrate 16 by two wires or bumps.

A sealing member 12 is provided on the upper surface of the substrate 16 and seals the light-emitting element 20 and the wire 24 on the substrate 16 (see FIGS. 1 and 2). The sealing member 12 is formed by a transparent or light-transmitting resin.

As shown in FIG. 2, an upper portion P1 of the left electrode 14 of the substrate 16 is a bonding portion of the light-emitting element 20, and an upper portion P4 of the right electrode 18 of the substrate 16 is a connection portion of the wire 24. Lower portions P3 and P2 of the electrode portions 14 and 18, respectively, of the substrate 16 are soldering-portions to a motherboard.

To mount the light-emitting element 20 on the substrate 16, the light-emitting element 20 may be bonded to the electrode portion 14 through eutectic bonding in place of bonding through the conductive paste 22. The lower electrode of the light-emitting element 20 may be provided in an upper part of the element 20. In this case, the light-emitting element 20 may be bonded to the substrate 16 through an insulating paste.

In the LED 10 of the present invention, an inorganic material (not shown), such as titanium dioxide, having a high light-shielding ratio and a high reflectivity is mixed in the sealing member 12 in order to adjust the luminance of the LED 10.

It should be noted that the amount of the inorganic material having a high light-shielding ratio and a high reflectivity is adjusted in accordance with the luminance of the light-emitting element 20.

For example, a small amount of the inorganic material is mixed in the sealing member 12 when the luminance of a light-emitting element 20 is low, and a large amount of the inorganic material is mixed in the sealing member 12 when the luminance of a light-emitting element 20 is high. This is because, when the amount of the inorganic material is low, the light from the light-emitting element undergoes diffuse reflection due to the high reflectivity of the inorganic material, resulting in an enhanced intensity of light emitted outside of the sealing member. In contrast, when the amount of the inorganic material is high, light from the light-emitting element is blocked due to the high light-shielding power of the inorganic material, resulting in a decreased intensity of light emitted outside of the sealing member.

Specifically, a plurality of sealing members 12 containing different amounts of the inorganic material having a high light-shielding ratio and a high reflectivity are prepared in advance, and the luminances of bare light-emitting elements 20 are measured. Then, the prepared sealing members 12 and also the bare light-emitting elements 20 or light-emitting elements 20 before being sealed by a sealing resin are ranked.

A suitable ranked sealing member 12 is selected for each light-emitting element 20 according to its intensity rank. When selecting a suitable sealing member 12, a sealing member 12 containing a small amount of the inorganic material is selected for a light-emitting element having a low luminance, and a sealing member 12 containing a large amount of the inorganic material is selected for a light-emitting element 20 having a high luminance.

A method for manufacturing the above light-emitting diode will now be described with reference to FIGS. 3 and 4.

Figure 3:
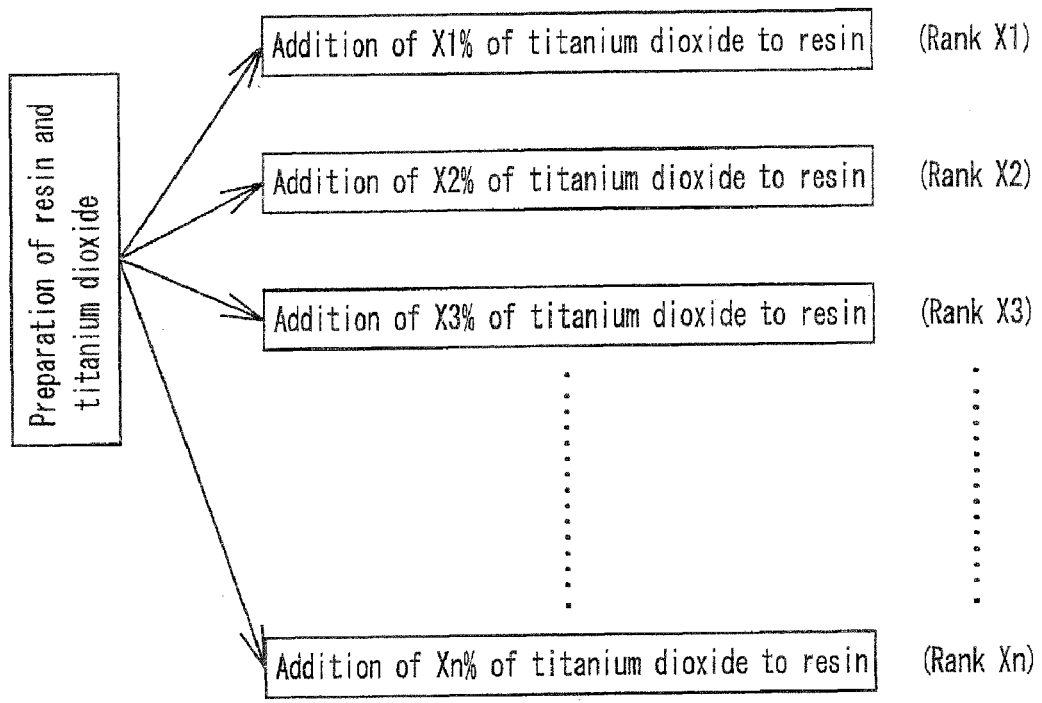
FIG. 3 is a diagram describing a sealing member producing step in an LED manufacturing method according to the present invention.
Figure 4:
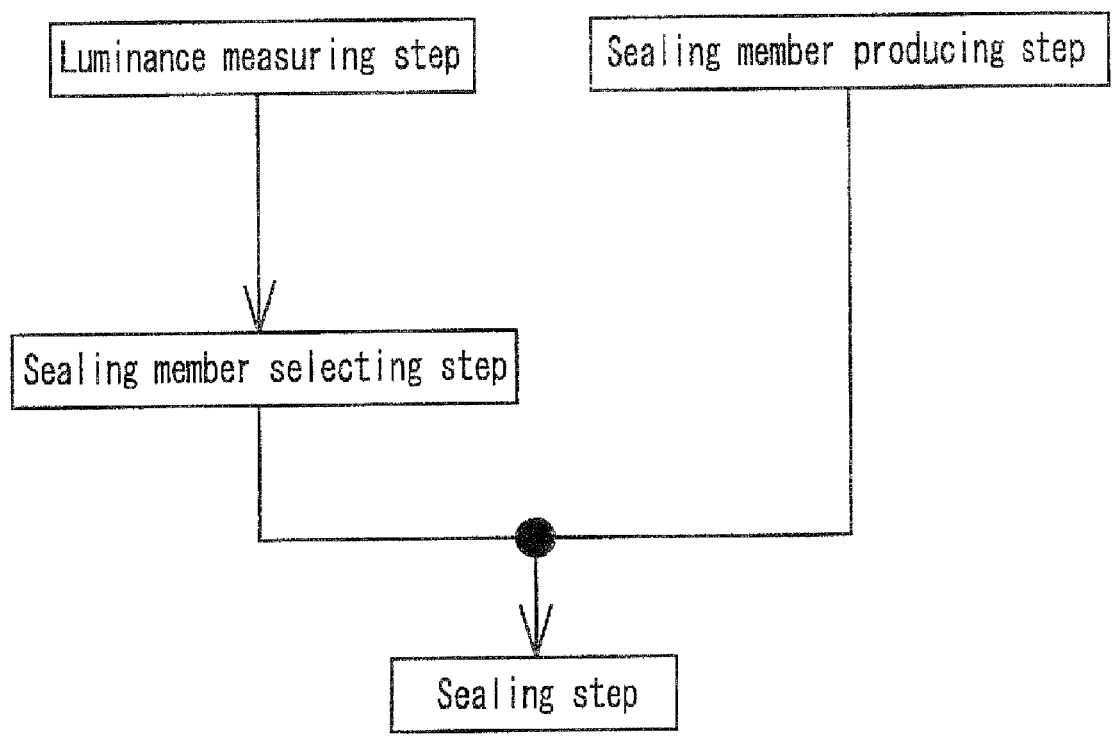
FIG. 4 is a process diagram describing the LED manufacturing method according to the present invention.

FIGS. 3 and 4 are diagrams describing the LED manufacturing method of the present invention. FIG. 3 describes a sealing member producing step, and FIG. 4 describes all the steps of sealing light-emitting elements by corresponding sealing resin.

In the LED manufacturing method of the present invention, light-emitting elements are sealed with sealing members. Specifically, the method includes: a sealing member producing step for producing a plurality of sealing members each containing a different amount of an inorganic material having a high light-shielding ratio and a high reflectivity; a luminance measuring step for measuring the luminance of each of a plurality of bare light-emitting elements and ranking each of the bare light-emitting elements according to the luminance thereof; a sealing member selecting step of selecting one of the ranked sealing members for each of the light-emitting elements according to the luminance rank of each of the light-emitting elements; and a sealing step for sealing each of the light-emitting elements with the corresponding selected one of the sealing members to form an LED.

In the sealing member selecting step, one of the sealing members is selected for each of the light-emitting elements such that a sealing member containing a small amount of the inorganic material is selected for a light-emitting element having a low luminance and that a sealing member containing a large amount of the inorganic material is selected for a light-emitting element having a high luminance.

More specifically, FIG. 3 is a diagram describing the sealing member producing step in the LED manufacturing method of the present invention. First, a resin and titanium dioxide serving as the inorganic material having a high light-shielding ratio and a high reflectivity are prepared.

Subsequently, titanium dioxide is added to the resin. The titanium dioxide is added such that a plurality of ranked types of sealing members are produced. Specifically, the sealing members are ranked according to the amount of titanium dioxide added to the resin and are classified into rank X1 (X1% of titanium dioxide is added to the resin), rank X2 (X2% of titanium dioxide is added to the resin), rank X3 (X3% of titanium dioxide is added to the resin), . . . , and rank Xn (Xn % of titanium dioxide is added to the resin). In this case, for example, the amount of titanium dioxide added is changed by 1% for each of the sealing members, and then the sealing members are ranked.

FIG. 4 is a diagram describing all the steps. First, in the luminance measuring step, the luminance of each of the bare light-emitting elements is measured, and the light-emitting element is ranked according to the luminance.

Subsequently, a sealing member suitable for the luminance of each light-emitting element that is measured in the luminance measuring step is selected from the sealing members produced in the sealing member producing step.

When selecting a suitable sealing member, a sealing member containing a small amount of the inorganic material (titanium dioxide) having a high light-shielding ratio and a high reflectivity is selected for a light-emitting element having a low luminance and a sealing member containing a large amount of the inorganic material (titanium dioxide) is selected for a light-emitting element having a high luminance.

Note that the amount of light emitted from each LED varies with the amount of an inorganic material, such as titanium dioxide, mixed in the sealing member. Therefore, variations in luminance of the LEDs can be reduced by controlling the amount of the inorganic material, such as titanium dioxide, added to each sealing member.

Specifically, as has been described, when the amount of titanium dioxide is low, the light from the light-emitting element undergoes diffuse reflection due to the high reflectivity of titanium dioxide, resulting in an enhanced intensity of light emitted outside of the sealing member. Conversely, when the amount of titanium dioxide is high, the light from the light-emitting element is blocked due to the high light-shielding power of titanium dioxide, resulting in a decreased intensity of light emitted outside of the sealing member.

In the subsequent sealing step, each light-emitting element and other components are sealed with the selected sealing member. In this manner, the amount of light emitted from each LED is controlled through the combination of the light-emitting element and the sealing member, and a uniform LED is thereby assembled.

In contrast to organic light absorbing agents, inorganic materials such as titanium dioxide have an advantage that the materials do not adversely affect the long-term reliability of the LED.

In this embodiment, titanium dioxide is mixed in the sealing member as the inorganic material having a high light-shielding ratio and a high reflectivity. However, for example, particles of other metals such as aluminum and silver also have a high light-shielding ratio and a high reflectivity. However, these particles must have a surface with diffusing and reflection treatments, and furthermore, the particles are electrically conductive. Therefore, the particles of such metals are not suitable for an inorganic material contained in the sealing member of a light-emitting element.

A white pigment is preferred as the inorganic material having a high light-shielding ratio and a high reflectivity. Examples of such a white pigment include, in addition to titanium dioxide, aluminum oxide, zinc oxide, and manganese dioxide. These white pigments have a high reflectivity. Note that iron-based inorganic pigments have a high light energy absorbance and are therefore not suitable.

Moreover, an inorganic material such as a glass filler has, however, a low light-shielding power. Therefore, a considerable amount of such a glass filler must be mixed in the sealing member in order to lower the luminance of the LED. This may cause the viscosity of the sealing member to increase. Also, the reflectivity of the glass filler is low. Therefore, a considerable amount of the glass filler must be mixed in the sealing member in order to increase the luminance of the LED. This again causes the viscosity of the sealing member to increase.

However, since titanium dioxide has both a high reflectivity and also a high light-shielding power, it is sufficient to add a small amount of titanium dioxide to the sealing member. Therefore, titanium dioxide has an advantage of little influence on the reliability and workability of the sealing member.

Moreover, in both the case that the light-emitting element is dark and the case that it is bright, the same material, i.e., titanium dioxide, can be mixed in the sealing member, with only a slight difference in the added amount, and reliability and workability are not greatly altered.

Since the thickness of the sealing member varies according to the shape of the package, the amount of the inorganic material to be added must be changed correspondingly.

In the exemplary embodiment shown in FIGS. 3 and 4, the sealing members are produced in advance. However, the sealing members may, of course, be produced after the luminances of the light-emitting elements have been measured and the amounts of the inorganic material required to be added have been accordingly determined.

The luminance measurement is not necessarily performed on all the light-emitting elements. For example, the variations in luminance of light-emitting elements within one wafer are small. Therefore, after the luminances of only a number of light-emitting elements in the wafer are measured, a suitable sealing member may be selected, or the required amount of the inorganic material to be added may be determined.

Figure 5:
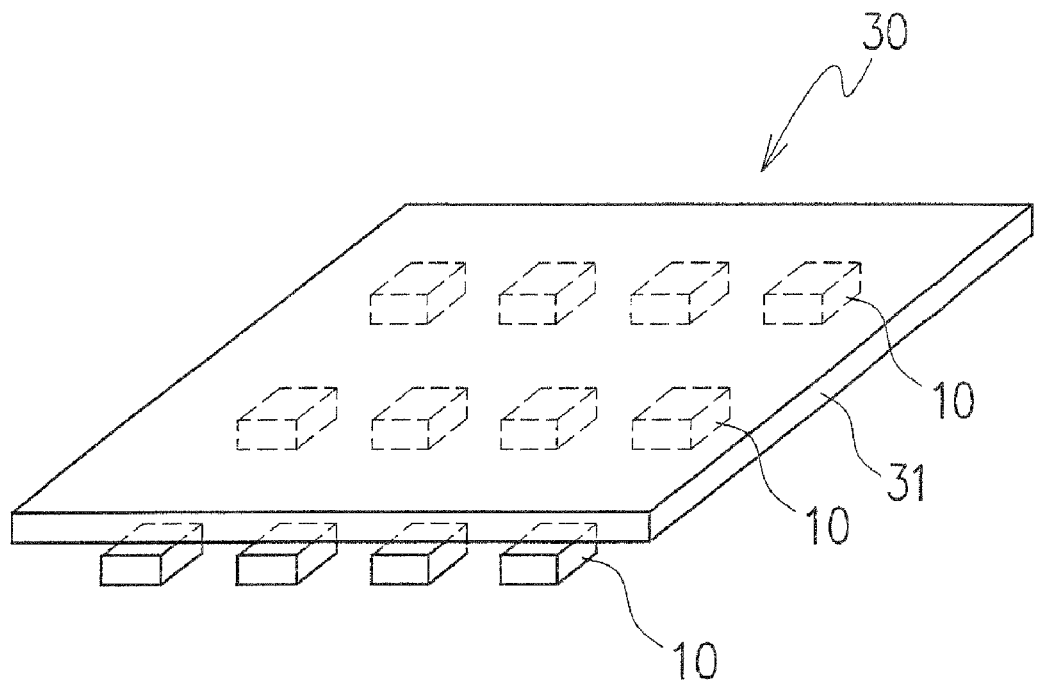
Figure 5:
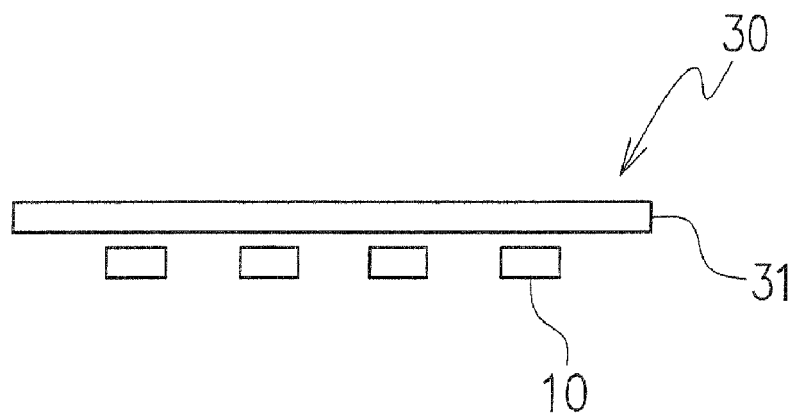

FIGS. 5A and 5B show an embodiment of a light source according to the present invention. This light source is configured as, for example, a backlight 30 for a liquid crystal display. Of course, the same effects can be obtained when this light source is used as a lighting device for interior illumination.

The backlight 30 includes a light guide plate 31 and a plurality of LEDs 10 disposed on one surface, e.g., the lower surface, of the light guide plate 31. Each of these LEDs 10 has a structure similar to that of the LED 10 described in the above embodiment. Specifically, each of the LEDs of this embodiment includes a light-emitting element and a sealing member to seal the light-emitting element, with an inorganic material having a high light-shielding ratio and a high reflectivity mixed in the sealing member. The LEDs 10 can be manufactured by means of the manufacturing method of the present invention described with reference to FIGS. 3 and 4. Accordingly, the plurality of LEDs 10 have been adjusted such that the luminances thereof are constant.

It is to be noted that in the backlight 30, the amounts of the inorganic material mixed in the sealing members of the LEDs 10 differ from one another or the light source includes a plurality of LEDs 10 at least one of which has an inorganic material mixed in the sealing member in a different amount from that of the others. This means that when the plurality of LEDs 10 are disposed on the lower surface of the light guide plate 31, the selected LEDs, which are produced in the sealing member producing step, include sealing members of different ranks.

Since the plurality of LEDs including the sealing members of different ranks shown in FIG. 3 are suitably selected as described above, the overall luminance of the backlight can be made uniform. Hence, when a large number of LEDs are arranged on one surface and are used simultaneously as in this backlight, improved uniformity of the overall luminance on the surface can be achieved.

In the exemplary embodiment shown in FIGS. 5A and 5B, the backlight 30 is of a so-called direct type in which the LEDs 10 are disposed on the lower surface of the light guide plate 31. However, the same effects can be obtained in a backlight of a so-called side-edge type in which the LEDs 10 are disposed to face a side portion of the light guide plate 31.

As has been described, in the LED according to the present invention, the amount of an inorganic material having a high light-shielding ratio and a high reflectivity is adjusted according to the luminance of a light-emitting element. Hence, the luminance of the light emitted through the sealing member can be freely adjusted. Therefore, in a light source using a plurality of LEDs, the overall luminance of the light emitted from the LEDs can be made uniform by adjusting the luminance of the light emitted from each LED.

According to the present invention, the luminances of LEDs can be adjusted in a simple manner even when the luminances of the light-emitting elements are nonuniform. In addition, the overall luminance of a light source including a plurality of LEDs can be made uniform.

While the preferred embodiments of the present invention have been described above, the present invention is not limited to these embodiments. It will be understood that various modifications and variations may be made to these embodiments.

What is claimed is:

1. A light-emitting diode comprising:
   a substrate;
   a plurality of light-emitting elements including at least one light-emitting element with a lower luminance than a luminance of at least one other light-emitting element and mounted on the substrate, and electrically connected to the substrate; and
   a plurality of sealing members disposed on the substrate and sealing the light-emitting elements and
   wherein at least one sealing member that seals the at least one light-emitting element with the lower luminance than the luminance of the at least one other light-emitting element contains less of an inorganic material than at least one sealing member that seals the at least one other light-emitting element, and
   the inorganic material has a light shielding and reflecting effect.

2. The light-emitting diode according to claim 1, wherein the inorganic material is titanium dioxide.

3. A light source used as for a lighting device or a backlight for liquid crystal display, the light source comprising:

a plurality of the light-emitting diodes according to claim 1; and a light guide plate disposed so as to receive light from the plurality of the light-emitting diodes.

4. A method for manufacturing a light-emitting diode, comprising:

a sealing member producing step for producing a plurality of sealing members each containing a different amount of an inorganic material having a high light-shielding ratio and a high reflectivity and ranking each of the plurality of sealing members according to the amount of the inorganic material mixed therein;

a luminance measuring step for measuring a luminance of each of a plurality of bare light-emitting elements and ranking each of the bare light-emitting elements according to the luminance thereof;

a sealing member selecting step for selecting one of the ranked sealing members for each of the light-emitting elements according to the luminance rank of each of the light-emitting elements; and a sealing step for sealing each of the light-emitting elements with the corresponding selected one of the sealing members to form a light-emitting diode, wherein in the sealing member selecting step, one of the sealing members is selected for each of the light-emitting elements such that a sealing member containing a small amount of the inorganic material is selected for a light-emitting element having a low luminance and that a sealing member containing a large amount of the inorganic material is selected for a light-emitting element having a high luminance.

5. The method for manufacturing a light-emitting diode according to claim 4, wherein the inorganic material having a high contrast ratio and a high reflectivity is titanium dioxide.

6. A light source comprising:

a plurality of substrates;

a plurality of light-emitting elements including at least one light-emitting element with a lower luminance than a luminance of at least one other light-emitting element and mounted on and electrically connected to the plurality of substrates;

a plurality of sealing members disposed on the plurality of substrates and sealing the light-emitting elements on the substrates; and wherein at least one sealing member that seals the at least one light-emitting element with the lower luminance than the luminance of the at least one other light-emitting element contains less of an inorganic material than at least one sealing member that seals the at least one other light-emitting element, and the inorganic material has a light shielding and reflecting effect.

7. The light source according to claim 6 further comprising:

a light guide plate disposed to face the plurality of light-emitting elements.

* * * * *